United States Patent
Ozanoglu et al.

(10) Patent No.: US 9,608,582 B2
(45) Date of Patent: Mar. 28, 2017

(54) METHOD FOR AN ADAPTIVE TRANSCONDUCTANCE CELL UTILIZING ARITHMETIC OPERATIONS

(71) Applicant: Dialog Semiconductor (UK) Limited, Reading (GB)

(72) Inventors: Kemal Ozanoglu, Istanbul (TR); Merve Toka, Istanbul (TR); Frank Kronmueller, Neudenau (DE)

(73) Assignee: Dialog Semiconductor (UK) Limited, Reading (GB)

( * ) Notice: Subject to any disclaimer, the term of this patent is extended or adjusted under 35 U.S.C. 154(b) by 38 days.

(21) Appl. No.: 14/695,492

(22) Filed: Apr. 24, 2015

(65) Prior Publication Data

US 2016/0315588 A1    Oct. 27, 2016

(51) Int. Cl.
  *H03F 3/45*      (2006.01)
  *H03G 3/00*      (2006.01)

(52) U.S. Cl.
  CPC ......... *H03G 3/007* (2013.01); *H03F 3/45183* (2013.01); *H03F 3/45475* (2013.01); *H03F 2203/45188* (2013.01); *H03F 2203/45288* (2013.01)

(58) Field of Classification Search
  CPC ........................................................ H03F 3/45
  USPC ......... 330/254, 278, 260, 285; 327/356, 360
  See application file for complete search history.

(56) References Cited

U.S. PATENT DOCUMENTS

| | | | |
|---|---|---|---|
| 5,223,743 A | 6/1993 | Nakagawara | |
| 5,999,052 A * | 12/1999 | Tang | H03F 3/45188 330/253 |
| 6,028,478 A * | 2/2000 | Seremeta | G05F 3/225 330/252 |
| 6,205,325 B1 * | 3/2001 | Groe | H03D 7/1433 455/118 |
| 6,842,071 B1 * | 1/2005 | Retz | H03F 3/45475 330/133 |

(Continued)

FOREIGN PATENT DOCUMENTS

WO    WO 2006 005957    1/2006

OTHER PUBLICATIONS

"A 200-MSample/s Trellis-Coded PRML Read/Write Channel with Analog Adaptive Equalizer and Digital Servo," by Roberto Alini et al., IEEE Journal of Solid-State Circuits, vol. 32, No. 11, Nov. 1997, pp. 1824-1838.

(Continued)

*Primary Examiner* — Patricia T Nguyen
(74) *Attorney, Agent, or Firm* — Saile Ackerman LLC; Stephen B. Ackerman

(57) ABSTRACT

A first transconductance cell having a differential input voltage $\Delta V1$ and a forced output current $\Delta I1$, has a bias set by a feedback loop. A second transconductance cell having a differential input voltage $\Delta V2$ and using the same biasing as the first cell has analytically identical transconductance. The second transconductance cell produces an output current $\Delta I2$ dependent on the product of the output current $\Delta I1$ of the first transconductance cell and the quotient of the second differential input voltage $\Delta V2$, and the first differential input voltage $\Delta V1$. The adaptive transconductance cells can be used to generate mathematic functions such as multiplication and division.

19 Claims, 11 Drawing Sheets

(56) References Cited

U.S. PATENT DOCUMENTS

| | | | |
|---|---|---|---|
| 9,007,096 B1* | 4/2015 | Carey | H03K 5/2481 |
| | | | 327/65 |
| 2002/0175756 A1 | 11/2002 | Cyrusian | |
| 2007/0075777 A1* | 4/2007 | Kim | H03F 3/45197 |
| | | | 330/259 |
| 2008/0294579 A1* | 11/2008 | Rapoport | A61B 5/04001 |
| | | | 706/12 |
| 2010/0237940 A1 | 9/2010 | Gilbert | |
| 2011/0084763 A1* | 4/2011 | Jones | H03F 3/45098 |
| | | | 330/254 |

OTHER PUBLICATIONS

"Operational Transconductance Amplifier-Based Nonlinear Function Syntheses," by Edgan Ranchez-Sinencio et al., IEEE Journal of Solid-State Circuits, vol. 24, No. 6, Dec. 1989, pp. 1576-1586.

\* cited by examiner

METHOD FOR AN ADAPTIVE TRANSCONDUCTANCE CELL UTILIZING ARITHMETIC OPERATIONS

FIELD

The present disclosure relates generally to signal processing circuits and more specifically to operational transconductance amplifiers.

BACKGROUND

One type of operational transconductance amplifier (OTA) is the voltage controlled current source (VCCS) whose differential input voltage produces an output current. There is usually an additional input for a current to control the amplifier's transconductance (gm) such that the transconductance of the cell is equal to a fixed current output divided by a fixed voltage input. This type of amplifier can be used in circuits that perform mathematical functions, or "operations" on input signals to obtain specific types of output signals.

A 200-MSample/s Trellis-Coded PRML Read/Write Channel with Analog Adaptive Equalizer and Digital Servo by Alini, et al. (1997), describes, as an example, a fully integrated partial response maximum likelihood (PRML) read/write IC with analog adaptive equalization operating up to 200 MSample/s. The chip implements both matched spectral null (MSN) trellis and standard PR4 Viterbi detectors, in the digital domain as well as digital servo. The device is integrated in a 0.7-/spl mu/m BiCMOS technology, has a die size of 54 mm/sup 2/, and dissipates 2 W with MSN code or 1.5 W with PR4 code at 4.5-V supply and 200 MSample/s. The VCCS OTA described utilizes a transconductance equal to a fixed output $\Delta I$ divided by a fixed input $\Delta V$.

Operational Transconductance Amplifier-Based Nonlinear Function Syntheses by Sanchez-Sinencio (1989), describes how the operational transconductance amplifier can be efficiently used for programmable nonlinear continuous-time function synthesis. Two efficient nonlinear function synthesis approaches are presented. The first approach is a rational approximation, and the second is a piecewise-linear approach. Test circuits have been fabricated using a 3-μm p-well CMOS process.

The OTA described by Sanchez-Sinencio may be used for arithmetic functions, such as a multiplier or a divider block. For a multiplier block, a two input four-quadrant multiplier has an output current given by:

$$I1 = Km \times V1 \times V2$$

where V1 and V2 are the input voltages, and Km a multiplier constant.

The signal level in the multiplier is restricted by a few hundred millivolts for V1 and V2 and Km is a process- and geometry-dependent constant.

For a divider block, Sanchez-Sinencio describes a two-input divider with a voltage output given by:

$$VO = Kr \times V1 / V2$$

where V1 and V2 are the input voltages and Kr is a constant, also dependent on process and temperature. The resulting output signal is proportional to the ratio of the input signals.

The transconductance of the OTA in Sanchez-Sinencio is fixed and dependent on process parameters, supply variance, and temperature. The output current depends on the square-law principal, making it invalid for state of the art CMOS processes. What is needed is an adaptive transconductance cell that can be used in an operational transconductance amplifier that is simpler, more compact, and immune to these secondary effects.

SUMMARY

Accordingly, it is an object of one or more embodiments of the present disclosure to provide an improved operational transconductance amplifier to be used as a general-purpose analog building block.

It is a further object of one or more embodiments of the disclosure to provide an adaptive transconductance technique that can be utilized to generate arithmetic functions such as multiplication and division. Other objects will appear hereinafter.

The above and other objects of the present disclosure may be accomplished in the following manner. Two voltage controlled current source circuits are configured to provide an output current dependent on the product of the output current of the first voltage controlled circuit, and the quotient of the input voltage of the second voltage controlled circuit and the input voltage of the first voltage controlled circuit. The voltage controlled circuits have identical adaptive transconductance cells with a bias set by a feedback loop. Because the voltage controlled circuits are configured to have a constant and analytically identical transconductance, multiplier and divider functions are insensitive to PVT issues, resulting in a significant advance in the state of the art.

The above and other objects are further accomplished by a method using adaptive transconductance cells to generate mathematic functions such as multiplication and division. The method provides a first voltage controlled current source having a differential voltage input and generates an output current from the first voltage controlled current source. The method also provides a second voltage controlled current source having a differential voltage input and generates an output current from the second voltage controlled current source. The method provides an output current from the second voltage controlled current source that is the product of the output current from the first voltage controlled current source and the quotient of the differential voltage input of the second voltage controlled current source and the differential voltage input of the first voltage controlled current source.

BRIEF DESCRIPTION OF THE DRAWINGS

The present disclosure will be more clearly understood from the following description taken in conjunction with the accompanying drawings in which like reference numerals designate similar or corresponding elements, regions and portions and in which.

DESCRIPTION

In one embodiment, the disclosure proposes the use of adaptive transconductance cells to create a constant transconductance. A first transconductance cell having an input voltage ΔV1 and a forced output current ΔI1, has a bias set by a feedback loop. A second transconductance cell having an input voltage ΔV2 and using the same biasing as the first, has a transconductance equal to the first transconductance cell, and produces an output current ΔI2 dependent on the product of the output current of the first transconductance cell and the quotient of the second input voltage and the first input voltage. The adaptive transconductance cells can be used to generate mathematic functions such as multiplication and division. Multiplication and division circuits are commonly used in signal processing and are known to those skilled in the art, generating various control signals or calculations. For example, to calculate power information, multiplication cells are commonly utilized.

Figure 1:
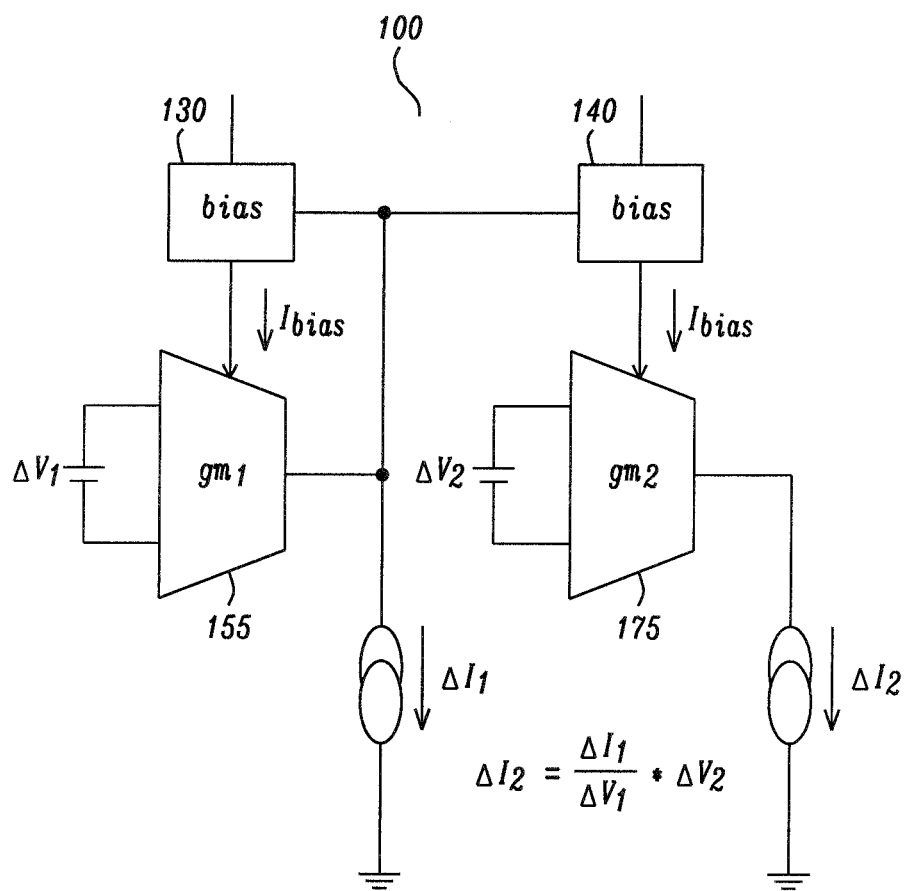
FIG. 1 shows a block diagram of an adaptive transconductance circuit, with transconductance cells gm1 and gm2, in a first preferred embodiment of the present disclosure.

FIG. 1 shows a block diagram of an adaptive transconductance circuit, with transconductance cells gm1 and gm2, in a first preferred embodiment of the present disclosure. The adaptive transconductance circuit comprises a first transconductance cell gm1 155 with an input voltage differential ΔV1 and a forced output current ΔI1. The loop which is formed by connecting the output of the first transconductance cell gm1 155 to the input of bias cell 130 determines the output current ΔI1 such that the transconductance of cell gm1 155 becomes ΔI1/ΔV1. The adaptive transconductance circuit further comprises a second transconductance cell gm2 175 with an input voltage differential ΔV2. The bias cell 140 of the second transconductance cell 175 is identical to bias cell 130 of the first transconductance cell such that the output current ΔI2 produced by the second transconductance cell 175 becomes:

$$\Delta I2 = gm1 \times \Delta V2 = (\Delta I1/\Delta V1) \times \Delta V2$$

Figure 2:
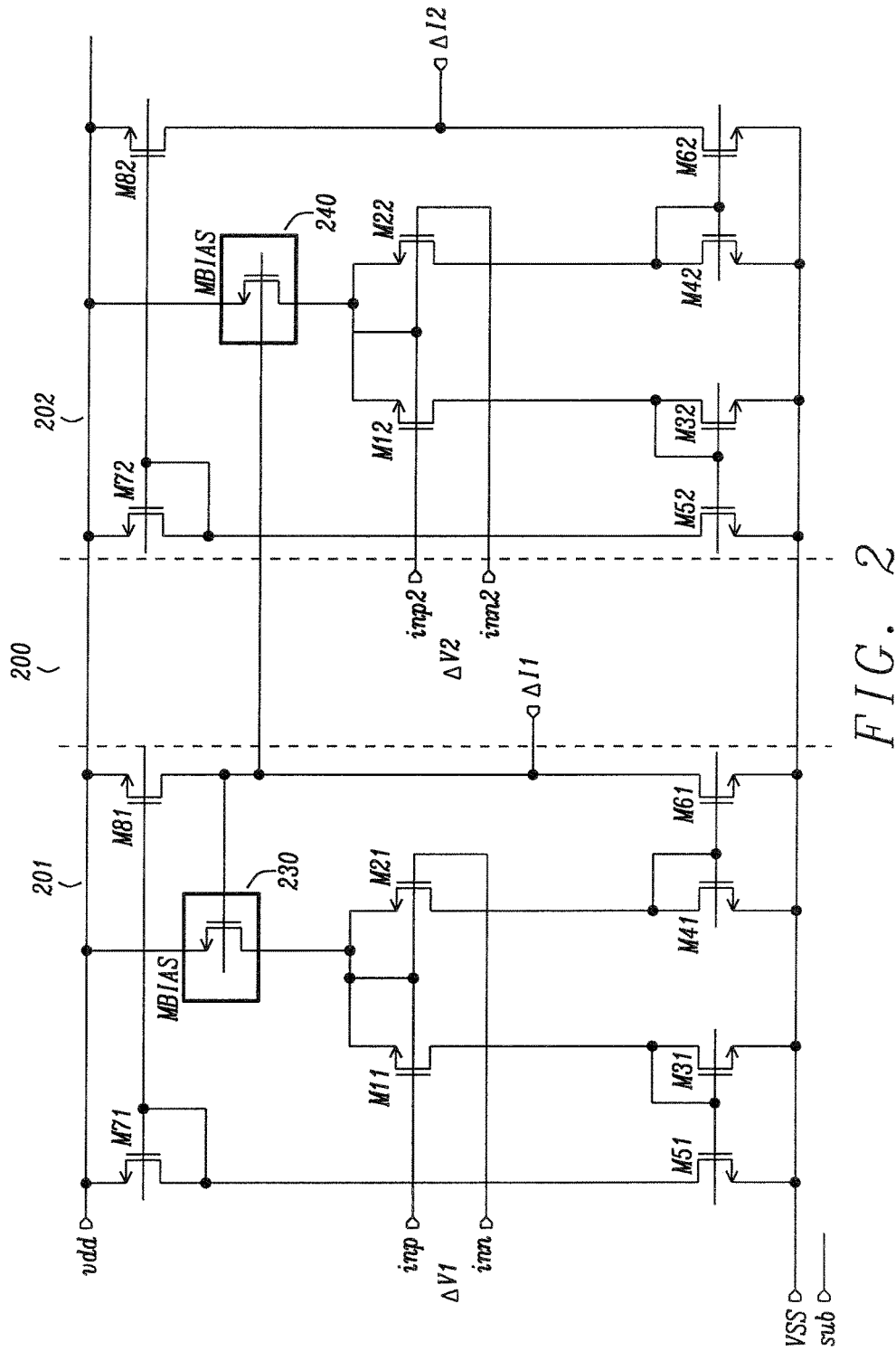
FIG. 2 illustrates a schematic design, at the transistor level, of an adaptive transconductance circuit, in a first preferred embodiment of the present disclosure.

FIG. 2 illustrates a schematic design, at the transistor level, of an adaptive transconductance cell, in a first preferred embodiment of the present disclosure. The adaptive transconductance cell comprises an input voltage VDD, a ground VSS, a substrate voltage SUB, and bias switches MBIAS 230 and MBIAS 240. The adaptive transconductance cell further comprises an input voltage differential ΔV1 which is set by the voltage difference at the non-inverting input INP1 of M11 and at the inverting input INN1 of M21. The adaptive transconductance cell further comprises an input voltage differential ΔV2 which is set by the voltage difference at the non-inverting input INP2 of M12 and at the inverting input INN2 of M22. The adaptive transconductance cell comprises an output current differential ΔI1, an output current differential ΔI2, a first stage amplifier 201, and a second stage amplifier 202. The operational transconductance amplifier in the first transconductance stage 201 generates a bias loop MBIAS 230 forming first transconductance ΔI1/ΔV1. The operational transconductance amplifier in the second stage 202 uses MBIAS 240 identical to MBIAS 230, and having input voltage differential ΔV2, generates output current:

$$\Delta I2 = (\Delta I1/\Delta V1) \times \Delta V2$$

The transconductance of second cell 202 equals the transconductance of first cell 201:

$$gm2 = (\Delta I1/\Delta V1) = gm1$$

In the adaptive transconductance cell of FIG. 2, the symmetric operational transconductance amplifier is an analog building block where a differential voltage at PMOS differential pair input pair M11 and M21, and M12 and M22, creates a differential current at the drain nodes of M11 and M21, and M12 and M22, respectively. This differential current is mirrored by NMOS current mirrors M31, M41, M51, M61 and M32, M42, M52, M62 and summed with PMOS current mirrors M71 and M81, and M72 and M82 respectively.

Figure 3:
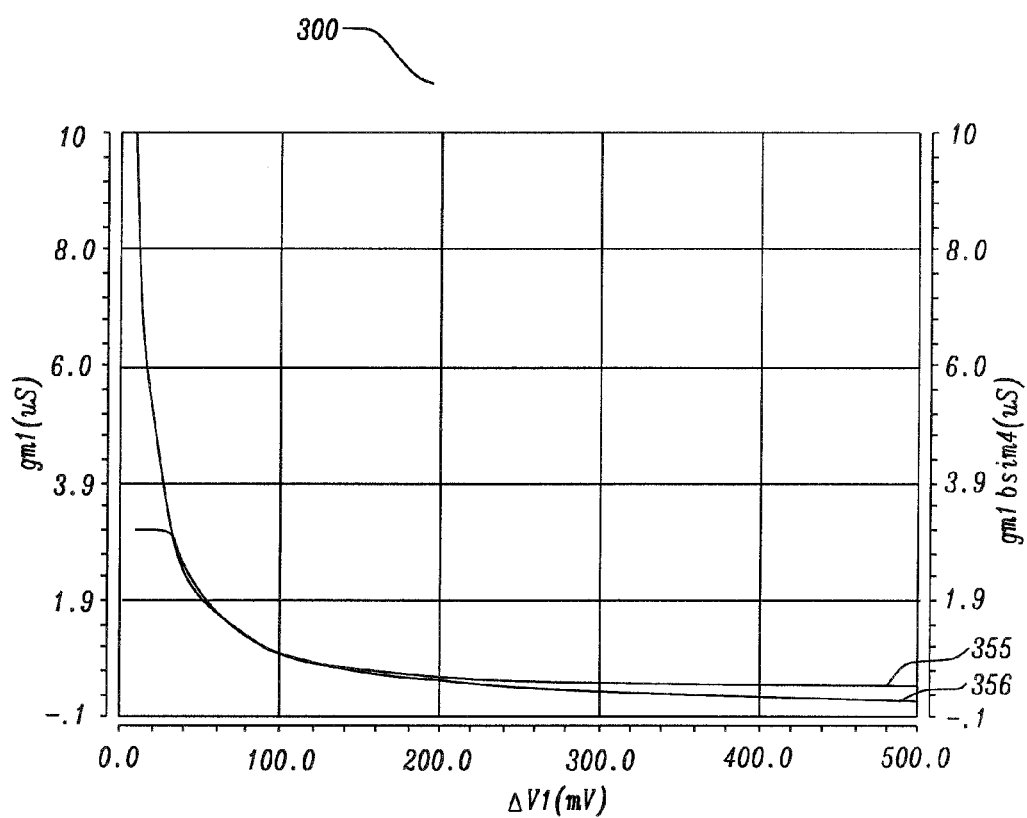
FIG. 3 shows transconductance gm1 compared to input voltage $\Delta V1$, in a first preferred embodiment of the present disclosure.
Figure 4:
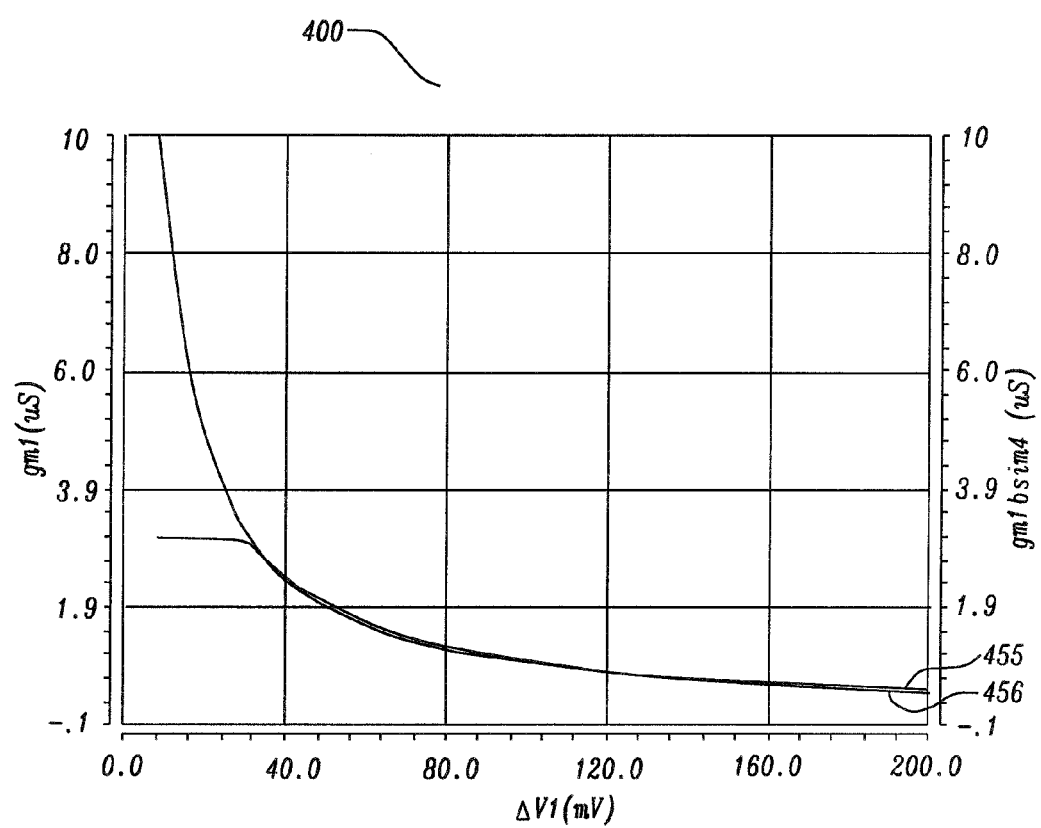
FIG. 4 illustrates transconductance gm1 compared to input voltage $\Delta V1$ magnified.

FIG. 3 and FIG. 4 (magnified) show simulation results for the first transconductance cell gm1 355, and an ideal-calculated transconductance 356, compared to the input voltage ΔV1. The reason of the discrepancy of the plots, between the simulated transconductance and calculated transconductance for the region ΔV1<35 mV, is that the given sizing of the MBIAS transistor cannot achieve the bias current for the required transconductance. For the region ΔV1>300 mV, linearity of the differential pair accounts for the discrepancy of the plots. For the region in between V1=35 mV and V1=300 mV, the simulated transconductance is shown to be inline with the calculated transconductance:

$$gm1 = (\Delta I1/\Delta V1)$$

The transconductance gm1 355 and 356 is inversely proportional to the input voltage ΔV1, and when the input voltage ΔV1 is increased, the transconductance gm1 355 and 356 is decreased. This is verified in FIG. 4 for first transconductance cell gm1 455, and an ideal-calculated transconductance 456, compared to the input voltage ΔV1 on a larger scale.

Figure 5:
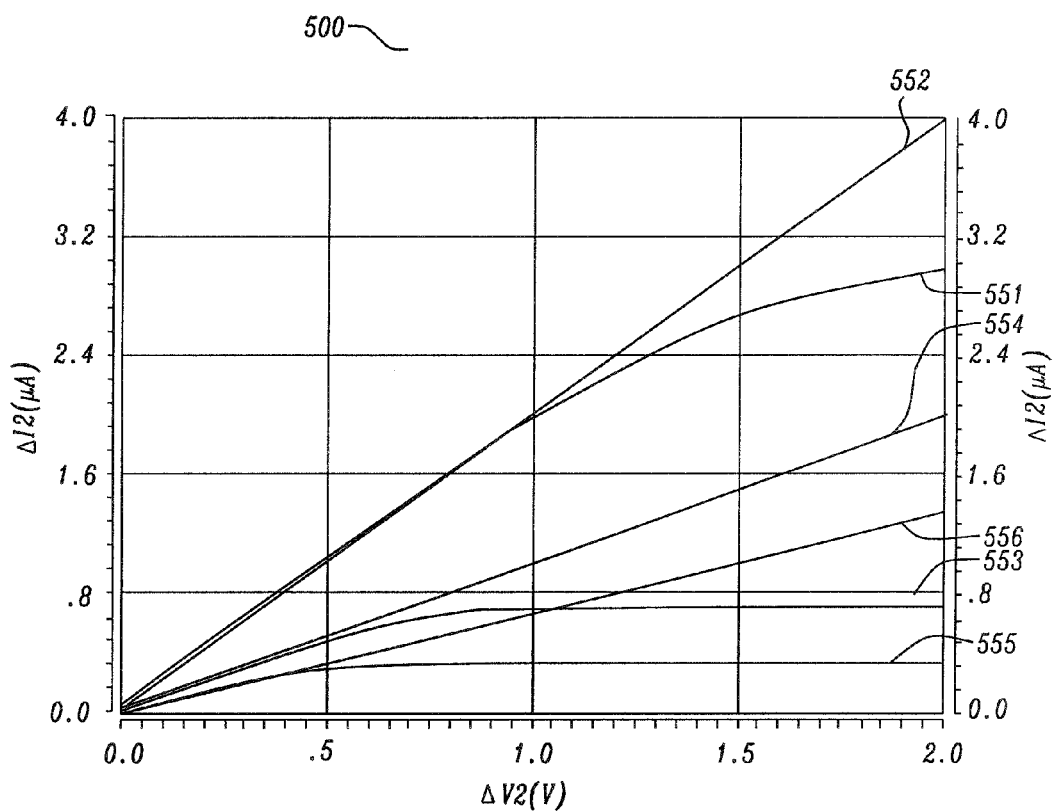
FIG. 5 shows output current ΔI2 compared to input voltage ΔV2 for various values of input voltage ΔV1, in a first preferred embodiment of the present disclosure.

FIG. 5 illustrates simulation results for the output current ΔI2, as well as an ideal-calculated output current, compared to the input voltage ΔV2, for different values of input voltage ΔV1 50 mV, 100 mV, and 150 mV. The output current ΔI2 is shown to be inline with the calculated output current and the output current ΔI2 is directly proportional to the input voltage ΔV2. When the input voltage ΔV2 is increased, the output current is thereby increased, as verified by the simulation. FIG. 5 also shows the output current ΔI2 is inversely proportional to the input voltage ΔV1. When the input voltage ΔV1 is increased from 50 mV, 100 mV, and 150 mV, the output current ΔI2 551 and 552(ideal), 553 and 554(ideal), 555 and 556(ideal) is decreased respectively.

Figure 6:
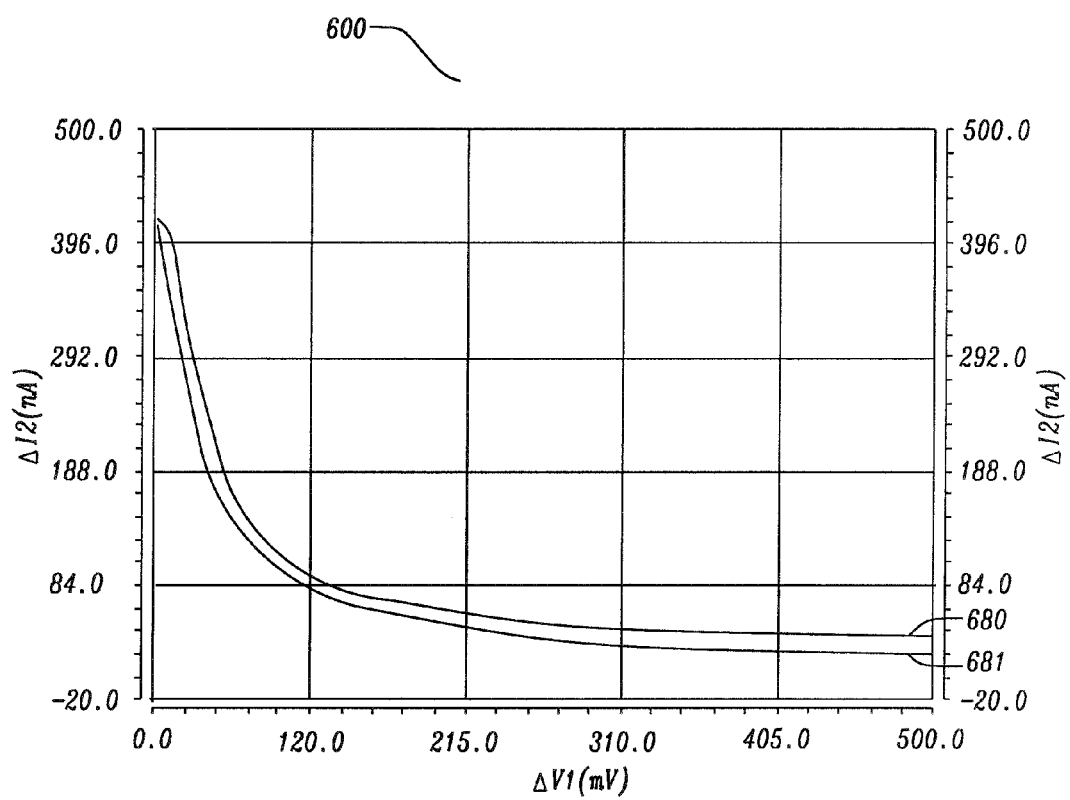
FIG. 6 illustrates output current ΔI2 compared to input voltage ΔV1.

FIG. 6 illustrates simulation results for the output current ΔI2 680, as well as an ideal-calculated output current 681, compared to the input voltage ΔV1. The output current ΔI2 680 is shown to be inline with the calculated output current 681 and the output current ΔI2 680 and 681 is inversely proportional to the input voltage ΔV1. When the input voltage ΔV1 is increased, the output current 680 and 681 is thereby decreased, as verified by the simulation.

In a first preferred embodiment of the present disclosure, the adaptive transconductance cell has an output current that is a linear function of the differential input voltage, calculated as ΔI2=gm2×ΔV2. ΔV2 is set by the voltage difference at the non-inverting input INP2 and at the inverting input INN2 and gm2 is the transconductance of the second stage of the amplifier. The voltage gain G of the second transconductance stage of the operational amplifier is then the output voltage VO divided by the differential input voltage ΔV2:

$$G=VO/\Delta V2=VO/(\Delta I2/gm2)=gm2\times(VO/\Delta I2)$$

where VO/ΔI2 is the impedance of the load of the second stage of the amplifier. When capacitance is placed across the output, the impedance of the load VO/ΔI2 varies as 1/(FREQ×CL) where FREQ is frequency, and load capacitance CL considers phase shifting.

The gain-bandwidth product GBW of the operational transconductance amplifier is the product of the bandwidth BW, the frequency at which the amplifier is designed to operate at, and the voltage gain G at which the bandwidth is measured. The frequency range handled by the amplifier might be specified in terms of this bandwidth BW, or by specifying a frequency response that is within a certain number of decibels between a lower and an upper frequency.

In one embodiment of the present disclosure, the adaptive transconductance cell of the operational amplifier can be used to generate a variable gain-bandwidth circuit, and can be used in gm-C filters. The load capacitance CL can be built sufficiently large enough to slow down the amplifier or small enough to maximize the signal to noise ratio in the circuit. A possible application of this technique is to achieve variable gain-bandwidth to be used in loop compensation filters, low frequency analog delay-locked loops, or variable frequency band pass filters.

In one embodiment of the present disclosure, gm1 is set by the first transconductance cell. Gm2 is such that the adaptive transconductance of the second transconductance cell equals the transconductance of the first cell.

Table 1 gives gain-bandwidth product GBW for input voltage ΔV1 values from 25 mV to 400 mV, for constant output current ΔI1.

| Input voltage (V1) @ constant<br>I1 = 100 nA | GBW |
|---|---|
| 25 mV | 52.35 kHz |
| 50 mV | 32.04 kHz |
| 100 mV | 15.68 kHz |
| 200 mV | 7.91 kHz |
| 400 mV | 5.41 kHz |

Figure 7:
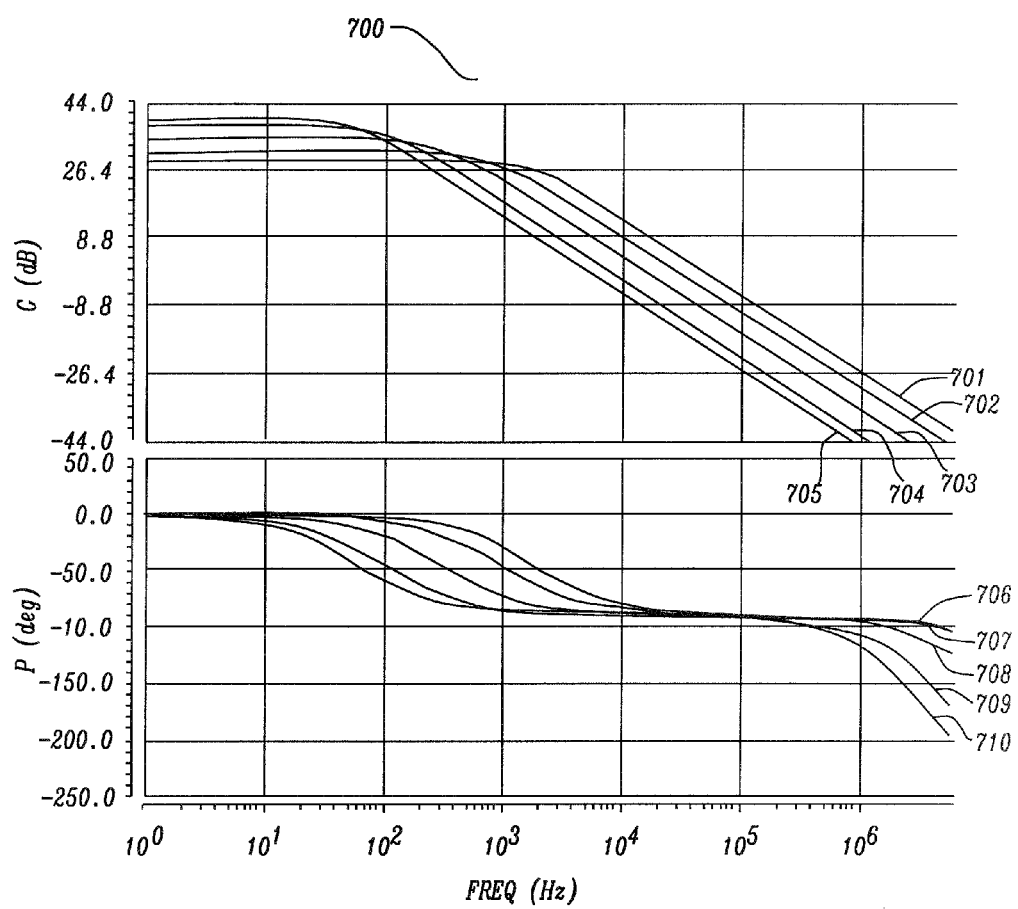
FIG. 7 shows the gain G and its phase P compared to frequency FREQ for various values of input voltage ΔV1, in an embodiment of the present disclosure.

FIG. 7 shows the gain G and its phase P, compared to frequency FREQ, for various values of input voltage ΔV1 25 mV, 50 mV, 100 mV, 200 mV, and 400 mV, at a constant current ΔI1, in a first preferred embodiment of the present disclosure. The gain-bandwidth product GBW for the amplifier at a given frequency FREQ is:

$$GBW=gm1/(FREQ\times CL)=(\Delta I1/\Delta V1)\times 1/(FREQ\times CL)$$

The gain G and its phase P, of the gain-bandwidth product GBW, are shown to be inversely proportional to the frequency FREQ. As the frequency FREQ is increased, the gain G and its phase P are thereby decreased. This is predicted by the gain-bandwidth product GBW equation and verified by the simulation shown in FIG. 7. Following the transconductance gm1, the gain G and its phase P are also inversely proportional to the input voltage ΔV1. As the input voltage ΔV1 is increased, from 25 mV, 50 mV, 100 mV, 200 mV, and 400 mV, the gain G 701, 702, 703, 704, 705 and its phase P 706, 707, 708, 709, 710 are decreased respectively.

Figure 8:
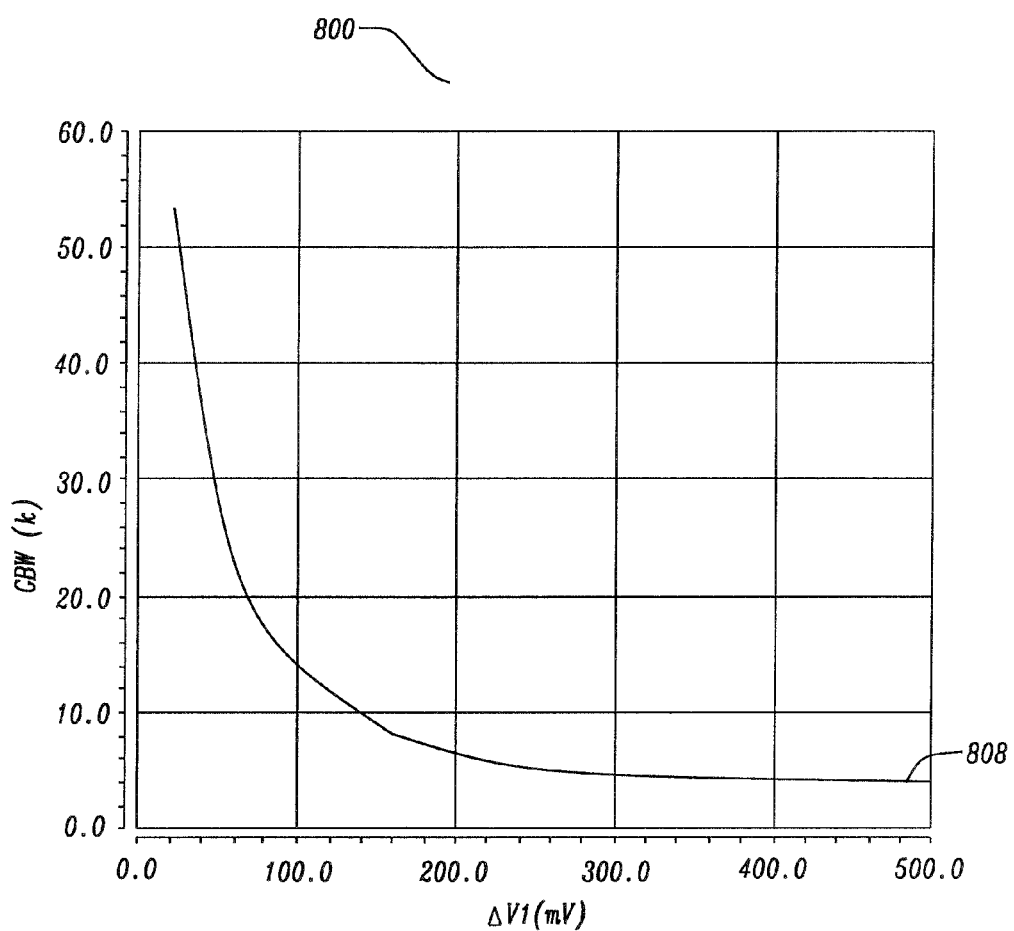
FIG. 8 illustrates gain-bandwidth product GBW compared to input voltage ΔV1.

FIG. 8 illustrates the gain-bandwidth product GBW 808 compared to input voltage ΔV1 and $$GBW=gm1/(FREQ\times CL)=(\Delta I1/\Delta V1)\times 1/(FREQ\times CL).$$

Gain-bandwidth product GBW 808 is confirmed to be inversely proportional to the input voltage ΔV1, and as the input voltage ΔV1 is increased, the gain-bandwidth product GBW 808 is decreased.

Figure 9:
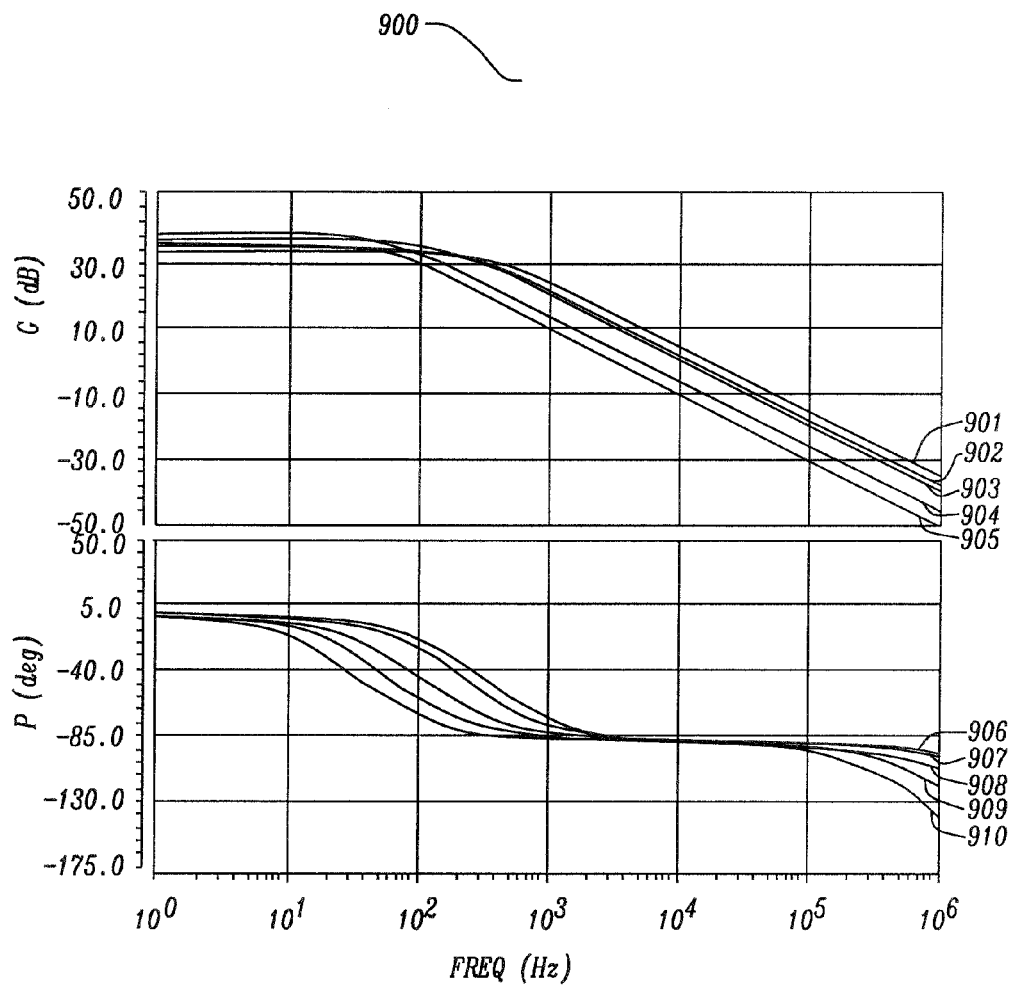
FIG. 9 shows the gain G and its phase P compared to frequency FREQ for various values of output current ΔI1, in an embodiment of the present disclosure.

FIG. 9 shows the gain G and phase P compared to frequency FREQ for various values of output current ΔI1 50 nA, 100 nA, 200 nA, 300 nA, and 500 nA, in a first preferred embodiment of the present disclosure. The gain G and its phase P, of the gain-bandwidth product GBW, are shown to be inversely proportional to the frequency FREQ. As the frequency FREQ is increased, the gain G and its phase P are decreased, as predicted by the gain-bandwidth product GBW equation and verified by the simulation shown in FIG. 9. Following the transconductance gm1, the gain G and its phase P are also directly proportional to the output current ΔI1. As the output current ΔI1 is increased, from 50 nA, 100 nA, 200 nA, 300 nA, and 500 nA, the gain G 905, 904, 903, 902, 901 and its phase P 910, 909, 908, 907, 906 are increased respectively.

Figure 10:
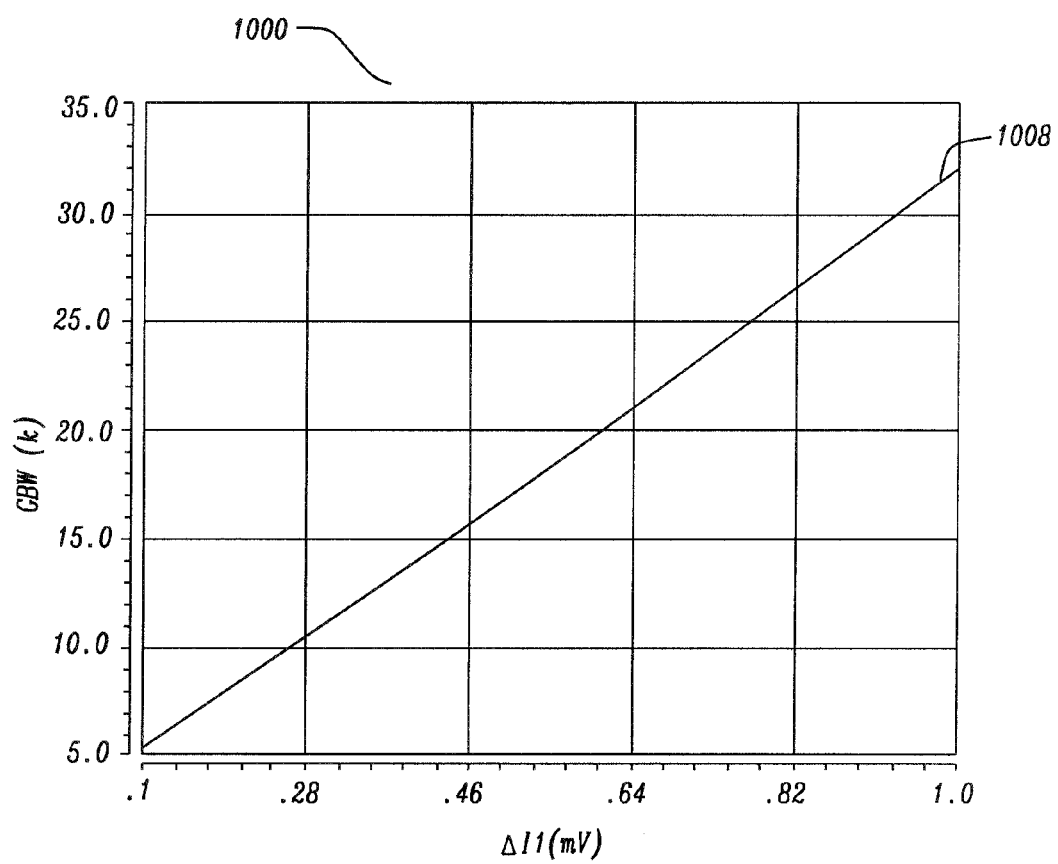
FIG. 10 illustrates gain-bandwidth product GBW compared to output current ΔI1.

FIG. 10 illustrates gain bandwidth product GBW 1008 compared to output current ΔI1 and $$GBW=gm1/(FREQ\times CL)=(\Delta I1/\Delta V1)\times 1/(FREQ\times CL).$$

Gain-bandwidth product GBW 1008 is confirmed to be directly proportional to the output current ΔI1, and as the output current ΔI1 is increased, the gain-bandwidth product GBW 1008 is increased.

Figure 11:
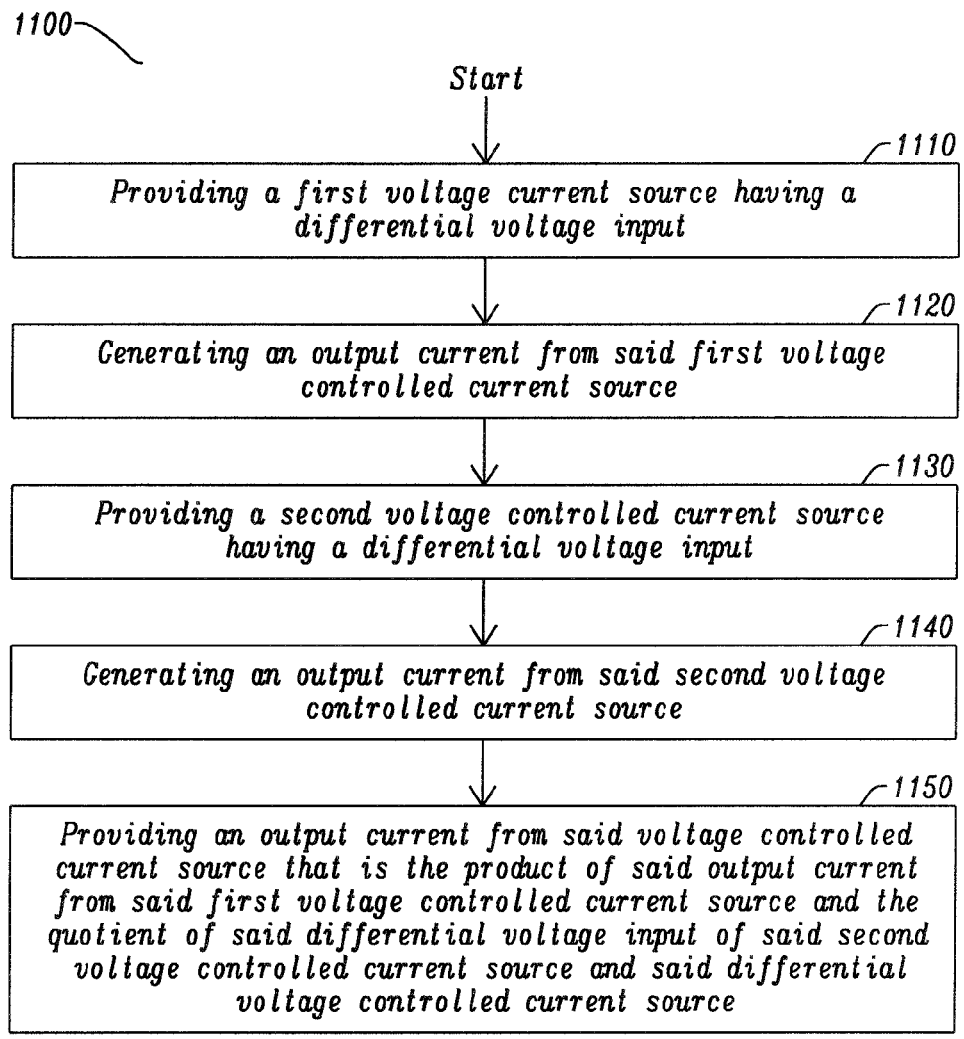
FIG. 11 shows a flowchart of a method disclosed for using adaptive transconductance cells to generate mathematic functions such as multiplication and division.

FIG. 11 shows a flowchart of a method for using adaptive transconductance cells to generate mathematic functions such as multiplication and division. Step 1110 of the method of FIG. 11 illustrates the provision of a first voltage controlled current source having a differential voltage input. Step 1120 depicts generating an output current from said first voltage controlled current source. Step 1130 illustrates the provision of a second voltage controlled current source having a differential voltage input. Step 1140 depicts generating an output current from said second voltage controlled current source. Step 1150 illustrates the provision of an output current from said second voltage controlled current source that is the product of said output current from said first voltage controlled current source and the quotient of said differential voltage input of said second voltage controlled current source and said differential voltage input of said first voltage controlled current source.

Advantages

The advantages of one or more embodiments of the present disclosure include an operational transconductance amplifier (OTA) that is fully differential and much more immune to process, voltage, and temperature (PVT) issues. Because of the identical bias cells in the voltage controlled current source circuits of the OTA, multiplier and divider functions are insensitive to PVT issues resulting in a significant advance in the state of the art. Analog devices such as these offer a wide selection of arithmetic functions for multiplier and divider circuits. Applications can include communications and industrial controls, where a real-time response is required.

While particular embodiments of the present disclosure have been illustrated and described, it is not intended to limit the disclosure, except as defined by the following claims.

What is claimed is:

1. A operational transconductance amplifier, comprising:
   a) a first and second voltage controlled current source circuit configured to provide an output current dependent on the product of the output current of the first voltage controlled circuit, and the quotient of the input voltage of the second voltage controlled current source circuit and the input voltage of the first voltage controlled current source circuit;
   b) each of said voltage controlled current source circuits having an adaptive transconductance cell connected to a bias, set by a feedback loop.

2. The operational transconductance amplifier of claim 1, wherein
   a) the first voltage controlled current source circuit has an input connected to a first differential voltage source;
   b) said first voltage controlled current source circuit has an output connected to a first bias cell;
   c) said first voltage controlled current source circuit has a transconductance configured to the quotient of the output current and the input voltage of said first voltage controlled current source circuit.

3. The operational transconductance amplifier of claim 1, wherein
   a) the second voltage controlled current source circuit has an input connected to a second differential voltage source;
   b) said second voltage controlled current source circuit is connected to a second bias cell;
   c) said second voltage controlled current source circuit has a transconductance configured to the quotient of the output current and the input voltage of said first voltage controlled current source circuit.

4. The operational transconductance amplifier of claim 1, wherein said second voltage controlled current source circuit has a bias cell identical to the bias cell of said first voltage controlled current source circuit.

5. The operational transconductance amplifier of claim 1, wherein said second voltage controlled current source circuit has a transconductance analytically equal to the transconductance of said first voltage controlled current source circuit, making the amplifier insensitive to process, voltage, and temperature issues.

6. The operational transconductance amplifier of claim 1, wherein said second voltage controlled current source circuit has an output current equal to the product of the transconductance of said first voltage controlled current source circuit and the input voltage of said second voltage controlled current source circuit.

7. The operational transconductance amplifier of claim 1, further comprising a multiplication circuit connected to the output of said second voltage controlled current source circuit, wherein the circuit is configured to perform a multiplication operation by using the product of said output current from said first voltage controlled current source.

8. The operational transconductance amplifier of claim 1, further comprising a division circuit connected to the output of said second voltage controlled current source circuit, wherein the circuit is configured to perform a division operation by using the quotient of said differential voltage input of said second voltage controlled current source and said differential voltage input of said first voltage controlled current source.

9. A method for using adaptive transconductance cells to generate mathematic functions such as multiplication and division, comprising:
   a) providing a first voltage controlled current source having a differential voltage input;
   b) generating an output current from said first voltage controlled current source;
   c) providing a second voltage controlled current source having a differential voltage input;
   d) generating an output current from said second voltage controlled current source;
   e) providing an output current from said second voltage controlled current source that is a function of the product of said output current from said first voltage controlled current source and a function of the quotient of said differential voltage input of said second voltage controlled current source and said differential voltage input of said first voltage controlled current source.

10. The method of claim 9, wherein said voltage controlled current sources provide adaptive transconductance cells with bias set by a feedback loop.

11. The method of claim 9, wherein said voltage controlled current sources provide a constant and analytically equal transconductance.

12. The method of claim 9, wherein said first and second voltage controlled current source circuits provide an operational transconductance amplifier performing the mathematical function of multiplication by amplifying the magnitude of the output current of said first voltage controlled current source.

13. The method of claim 9, wherein said first and second voltage controlled current source circuits provide an operational transconductance amplifier performing the mathematical function of division by reducing the magnitude of the differential voltage input of said second voltage controlled current source.

14. The method of claim 9, generating mathematical functions insensitive to process, voltage, and temperature issues, resulting in a significant advance in the state of the art.

15. A variable gain-bandwidth circuit, comprising:
   a) a first and second voltage controlled current source circuit, configured to provide an output current;
   b) each of said voltage controlled current source circuits connected to an identical bias cell;
   c) each of said voltage controlled current source circuits having an analytically identical transconductance; and
   d) each of said voltage controlled current source circuits having adaptive transconductance, enabling arithmetic functions such as multiplication and division.

16. The variable gain-bandwidth circuit of claim 15, where a load capacitance is connected across the output of said second voltage controlled current source circuit.

17. The variable gain-bandwidth circuit of claim 15, where the gain is directly proportional to the output current of said first voltage controlled current source circuit.

18. The variable gain-bandwidth circuit of claim 15, where said gain is inversely proportional to the differential voltage input of said first voltage controlled current source circuit.

19. The variable gain-bandwidth circuit of claim 15, where said load capacitance can be built sufficiently large enough to slow down a signal or small enough to maximize the signal to noise ratio in said circuit.

* * * * *